(12) United States Patent
Hirano

(10) Patent No.: US 6,566,964 B1
(45) Date of Patent: May 20, 2003

(54) FREQUENCY SYNTHESIZER AND OSCILLATION FREQUENCY CONTROL METHOD

(75) Inventor: Shunsuke Hirano, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/696,031

(22) Filed: Oct. 26, 2000

(30) Foreign Application Priority Data

Oct. 29, 1999 (JP) .......................................... 11-308132

(51) Int. Cl.[7] .............................................. H03L 7/197
(52) U.S. Cl. ........................ 331/1 A; 331/16; 331/25; 327/156; 327/159; 377/48; 455/260; 708/271
(58) Field of Search ............................ 331/1 A, 16, 25; 377/48; 327/156, 159; 455/260; 708/271

(56) References Cited

U.S. PATENT DOCUMENTS

| | | | |
|---|---|---|---|
| 5,014,231 A | * 5/1991 | Reinhardt et al. | .......... 708/271 |
| 5,070,310 A | 12/1991 | Hietala et al. | ............ 331/1 A |
| 5,305,362 A | * 4/1994 | Miller | .......................... 377/48 |

\* cited by examiner

*Primary Examiner*—Arnold Kinkead
(74) *Attorney, Agent, or Firm*—Stevens, Davis, Miller & Mosher, LLP

(57) ABSTRACT

Accumulator 201 accumulates data K (K: integer) for every clock and outputs a carry-out signal at the time of an overflow. Random signal generator 202 outputs a random signal for every clock. Adder 203 adds the carry-out signal and random signal to data M (M: integer), changes the frequency dividing ratio randomly and converts spurious to white noise. This makes it possible to optimally maintain the spurious characteristic, shorten the lockup time and reduce power consumption.

17 Claims, 8 Drawing Sheets

FREQUENCY SYNTHESIZER AND OSCILLATION FREQUENCY CONTROL METHOD

BACKGROUND OF THE INVENTION

1. Field of the Invention

The present invention relates to a frequency synthesizer mounted on a base station apparatus or communication terminal apparatus in a radio communication system and an oscillation frequency control method.

2. Description of the Related Art

A frequency synthesizer is mounted on a base station apparatus or communication terminal apparatus in a radio communication system in order to create a carrier wave of an arbitrary frequency from a reference signal.

The frequency synthesizer is required to have a short lockup time to reduce power consumption during intermittent reception. As a frequency synthesizer with a short lockup time, a frequency synthesizer according to a fractional N system is known, which with a time-variable frequency dividing ratio, controls the frequency dividing ratio so that an average of the frequency dividing ratio includes decimals.

The "lockup time" refers to a time after a frequency dividing ratio is changed until the frequency of an output signal of a voltage control oscillator converges to a target frequency.

Hereinafter a conventional frequency synthesizer according to a fractional N system (hereinafter simply referred to as "frequency synthesizer") will be explained using the attached drawings. FIG. 1 is a block diagram showing a configuration of the conventional frequency synthesizer.

In FIG. 1, VCO (voltage control oscillator) 1 oscillates a signal of frequency fvco according to the voltage of an input signal. First frequency divider 2 divides frequency fvco of the output signal of VCO 1 based on the frequency dividing ratio input from frequency dividing ratio control circuit 7, which will be described later, and outputs a signal of frequency fdiv.

Oscillator 3 oscillates a reference signal of frequency fosc. Second frequency divider 4 divides frequency fosc of the reference signal with a fixed frequency dividing ratio and outputs a signal of frequency fref. When locked, frequency fdiv of the output signal of first frequency divider 2 is equal to frequency fref of the output signal of second frequency divider 4.

Phase comparator 5 compares the phase of the output signal of first frequency divider 2 with the phase of the output signal of second frequency divider 4 and calculates the phase difference. LPF (low-pass filter) 6 averages the output value of phase comparator 5 and outputs the average result to VCO 1. This removes the AC component from the output value of phase comparator 105 and only a signal with the DC component is input to VCO 1.

Frequency dividing ratio control circuit 7 calculates a frequency dividing ratio to be output to first frequency divider 2 using the output signal of first frequency divider 2 as a clock. At this time, frequency dividing ratio control circuit 7 controls the frequency dividing ratio so that the frequency dividing ratio is time-variable and the average value of the frequency dividing ratio includes decimals.

Next, an internal configuration of frequency dividing ratio control circuit 7 in the conventional frequency synthesizer disclosed in the International Publication No.WO92/04766 will be explained using a block diagram in FIG. 2.

As shown in FIG. 2, frequency dividing ratio control circuit 7 in the conventional frequency synthesizer is mainly configured by a plurality of cascaded accumulators 11, delay circuits 12 that delay carry-out signals output from accumulators 11 and adder 13 that adds up the output signals of delay circuits 12.

In FIG. 2, the number of accumulators 11 used is "4" and the number of delay circuits 12 is "12" for frequency dividing ratio control circuit 7, but the above described frequency synthesizer has no limitation on the number of accumulators 11 and the number of delay circuits 12.

Data K (K: integer) is input to accumulator 11-1 and data M (M: integer) is input to adder 13.

Accumulators 11-1 to 11-4 each use the output signal of first frequency divider 2 as a clock, accumulate the input data for every clock and output a carry-out signal when the accumulation result exceeds size L (L: integer) of the accumulators.

Adder 13 adds "1" to data M when a carry-out signal is input and adds nothing to data M when no carry-out signal is input. Then, adder 13 outputs the addition result to first frequency divider 2 as a frequency dividing ratio.

That is, the frequency dividing ratio becomes (M+1) at a rate of K/L, and M at a rate of (1−K/L). Therefore, average value Rave of the frequency dividing ratio is obtained from expression (1) below:

$$Rave = (M+1) \times K/L + M \times (1 - K/L) \quad (1)$$
$$= M + K/L$$

where, M, L and K are all integers and K<L, and therefore the average of the frequency dividing ratio Rave includes decimals.

Furthermore, frequency fvco of the output signal of VCO 1 is obtained from expression (2) below:

$$fvco = (M + K/L) \times fdiv \quad (2)$$
$$= (M + K/L) \times fref$$

Moreover, the relationship between desired frequency interval fstp necessary for output in VCO 1 and L is expressed in expression (3) below:

$$fstp = fref/L \quad (3)$$

As is clear from expression (3) above, frequency fref can be increased by increasing L.

As shown above, the frequency synthesizer according to the fractional N system can average its frequency dividing ratio by changing the frequency dividing ratio to be set in first frequency divider 2 with time in synchronization with frequency fdiv of the output signal of first frequency divider 2, and therefore frequency fvco need not be set to an integer multiple of frequency fref. Because of this, it is possible to set high frequency fref irrespective of desired frequency interval fstp in the output signal of VCO 1.

Then, it is possible to increase the loop gain of a PLL comprising the frequency synthesizer by setting high frequency fref, making it possible to shorten the lockup time.

Since a carry-out signal has periodicity and unnecessary spurious is generated on the output signal of VCO 1 if only accumulator 11-1 is used, accumulators 11-2 to 11-4 and delay circuits 12-1 to 12-12 are additionally provided to cancel out the periodic component and prevent unnecessary spurious.

However, the conventional frequency synthesizer above has a problem that L may become an integer multiple of K depending on frequency fvco of the output signal of VCO 1, in which case spurious different from the spurious above is generated. As a simple example of this, a case with K=2 and L=8 will be explained. Table 1 shows accumulation results of accumulators 11-1 to 11-4 for different clocks.

TABLE 1

| Clock | Accumulator 11-1 | Accumulator 11-2 | Accumulator 11-3 | Accumulator 11-4 |
|---|---|---|---|---|
| 1 | 0 | 0 | 0 | 0 |
| 2 | 2 | 0 | 0 | 0 |
| 3 | 4 | 2 | 0 | 0 |
| 4 | 6 | 6 | 2 | 0 |
| 5 | 0 | 4 | 0 | 2 |
| 6 | 2 | 4 | 4 | 2 |
| 7 | 4 | 6 | 0 | 6 |
| 8 | 6 | 2 | 6 | 6 |
| 9 | 0 | 0 | 0 | 4 |
| 10 | 2 | 0 | 0 | 4 |
| 11 | 4 | 2 | 0 | 4 |
| 12 | 6 | 6 | 2 | 4 |
| 13 | 0 | 4 | 0 | 6 |
| 14 | 2 | 4 | 4 | 6 |
| 15 | 4 | 6 | 0 | 2 |
| 16 | 6 | 2 | 6 | 2 |
| 17 | 0 | 0 | 0 | 0 |
| 18 | 2 | 0 | 0 | 0 |
| 19 | 4 | 2 | 0 | 0 |
| 20 | 6 | 6 | 2 | 0 |

As shown in Table 1, the accumulation results of all accumulators become equal with clock 1 and clock 17, and a frequency component of fref/16 is generated. This frequency component appears as spurious with the output signal of VCO 1. To suppress spurious due to this frequency component, the time constant of the LPF must be increased, which will result in an increased lockup time.

Moreover, as described in the International Publication No.WO92/04766, it is desirable that size L (=fref/fstp) of an accumulator be power of 2 to simplify the circuit. On the contrary, the conventional frequency synthesizer above has a problem that there are cases where the frequency of a reference signal cannot be selected so that fref/fstp becomes power of 2.

As a countermeasure, a method of setting extremely high L (e.g., 24th power of 2) and slightly shifting frequency fvco from a desired frequency is known, but this method will increase the scale of circuit, resulting in increased power consumption.

SUMMARY OF THE INVENTION

It is an object of the present invention to provide a frequency synthesizer and oscillation frequency control method with a good spurious characteristic, a short lockup time and small power consumption.

The present invention attains the above object by randomly changing a frequency dividing ratio by adding a random signal to a carry-out signal and converting spurious to white noise.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

With reference now to the attached drawings, embodiments of the present invention will be explained in detail below.

Embodiment 1

Figure 3:
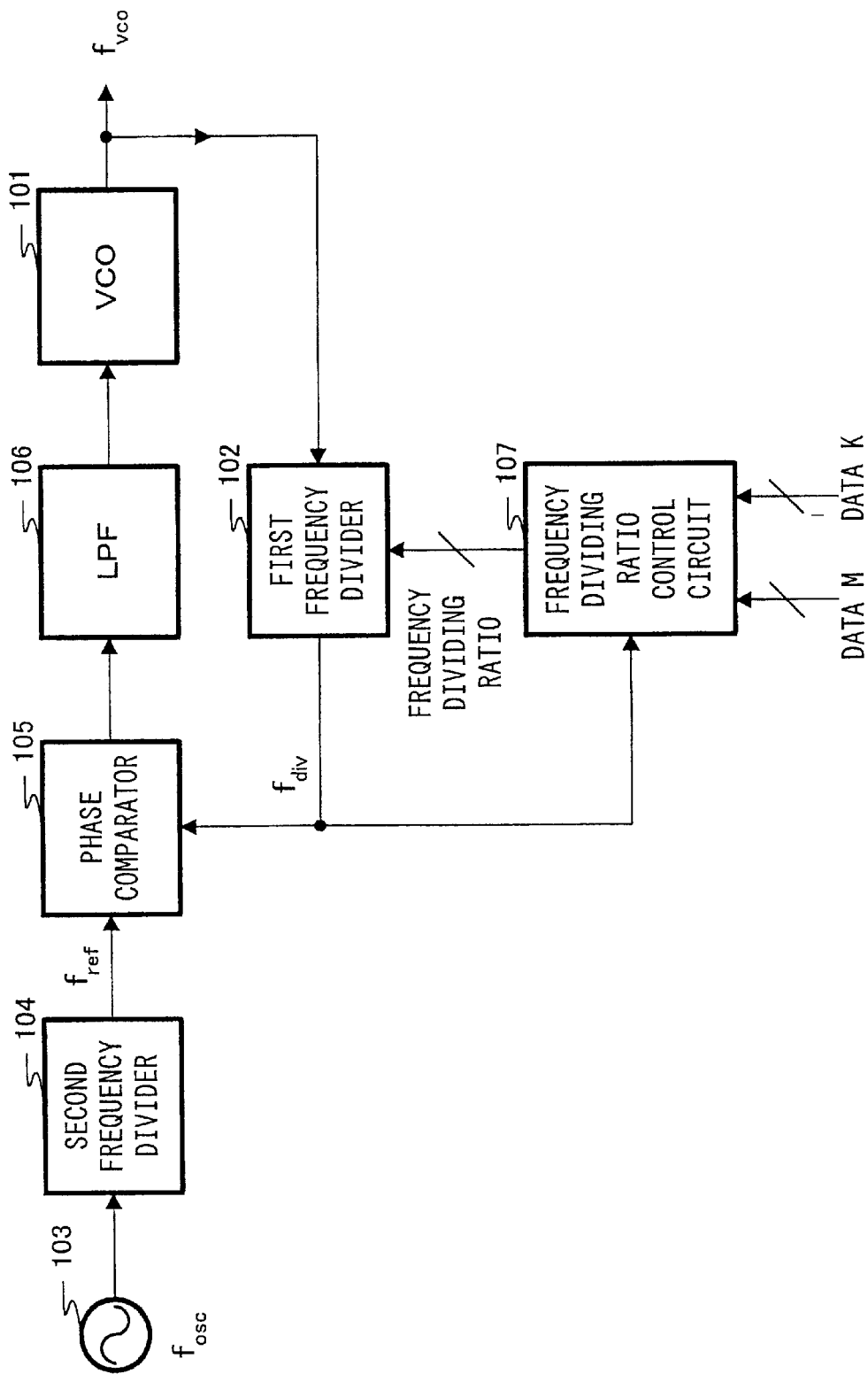
FIG. 3 is a block diagram showing a configuration of a frequency synthesizer according to Embodiment 1 of the present invention.

FIG. 3 is a block diagram showing a configuration of a frequency synthesizer according to Embodiment 1 of the present invention.

In FIG. 3, VCO (voltage control oscillator) 101 oscillates a signal of frequency fvco according to the voltage of an input signal. First frequency divider 102 divides frequency fvco of the output signal of VCO 101 based on the frequency dividing ratio input from frequency dividing ratio control circuit 107, which will be described later, and outputs a signal of frequency fdiv.

Oscillator 103 oscillates a reference signal of frequency fosc. Second frequency divider 104 divides frequency fosc of the reference signal with a fixed frequency dividing ratio and outputs a signal of frequency fref. When locked, frequency fdiv of the output signal of first frequency divider 102 is equal to frequency fret of the output signal of second frequency divider 104.

Phase comparator 105 compares the phase of the output signal of first frequency divider 102 with the phase of the output signal of second frequency divider 104 and calculates the phase difference. LPF (low-pass filter) 106 averages the output value of phase comparator 105 and outputs the average result to VCO 101. This removes the AC component from the output value of phase comparator 105 and only a signal with the DC component is input to VCO 101.

Frequency dividing ratio control circuit 107 calculates a frequency dividing ratio to be output to first frequency divider 102 using the output signal of first frequency divider 102 as a clock. At this time, frequency dividing ratio control circuit 107 controls the frequency dividing ratio so that the frequency dividing ratio is time-variable and the average value of the frequency dividing ratio includes decimals. The internal configuration of frequency dividing ratio control circuit 107 will be described later.

Next, a signal flow in the frequency synthesizer shown in FIG. 3 will be explained.

The reference signal of frequency fosc generated by oscillator 103 is divided by second frequency divider 104 with a fixed frequency diving ratio and a signal of frequency fref is output. On the other hand, a signal of frequency fvco output from VCO 101 is divided by first frequency divider 102 with a frequency dividing ratio controlled by frequency dividing ratio control circuit 107 and a signal of frequency fdiv is output.

Then, comparator 105 calculates the phase difference between the phase of the output signal of first frequency divider 102 and the phase of the output signal of second frequency divider 104 and the calculated phase difference is averaged by LPF 106 and a DC signal, the averaging result, is output to VCO 101. VCO 101 oscillates a signal of frequency fvco newly controlled according to the voltage of the input DC signal.

Next, the internal configuration of frequency dividing ratio control circuit 107 shown in FIG. 3 will be explained using the block diagram in FIG. 4.

Figure 4:
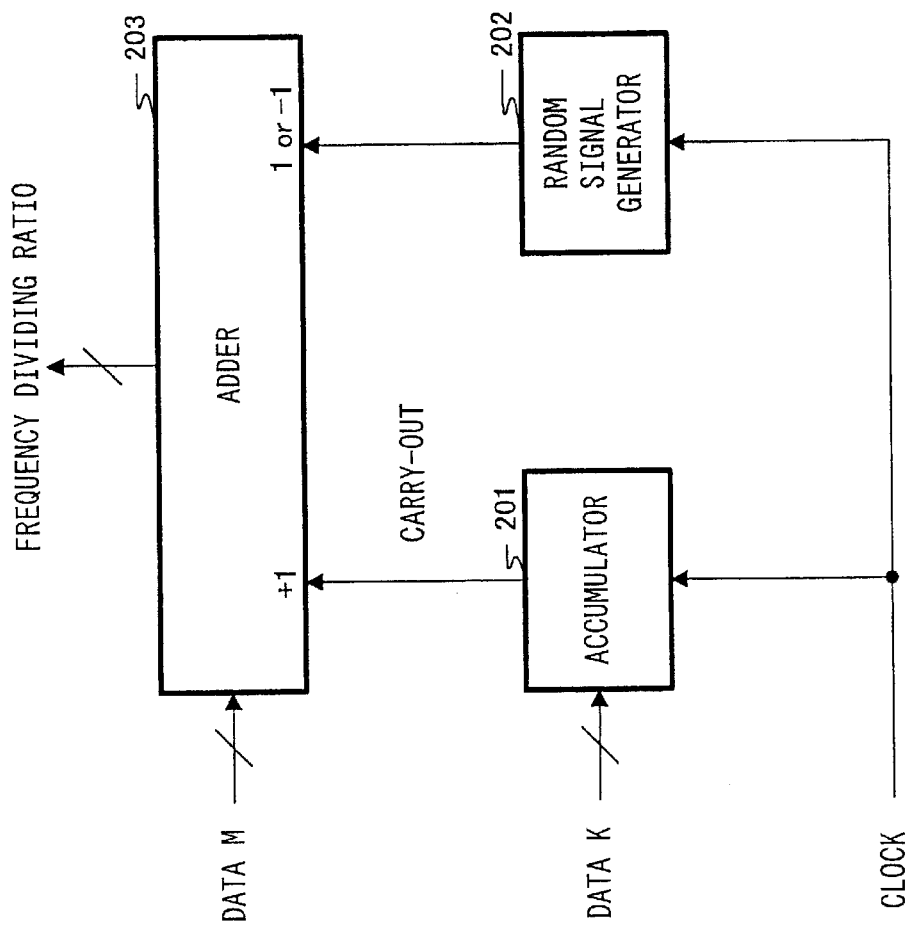
FIG. 4 is a block diagram showing an internal configuration of a frequency dividing ratio control circuit of the frequency synthesizer according to the above embodiment.

As shown in FIG. 4, frequency dividing ratio control circuit 107 is mainly configured by accumulator 201 that accumulates data K (K: integer) for every clock and outputs a carry-out signal at the time of an overflow, random signal generator 202 that outputs a random signal for every clock and adder 203 that adds the carry-out signal and random signal to data M (M: integer) and outputs a frequency dividing ratio to first frequency divider 102.

The random signal output from random signal generator 202 is "1" or "−1" and the average value of the random signal is "0". The configuration of random signal generator 202 itself is already publicly known such as a PN signal generator.

Figure 5:
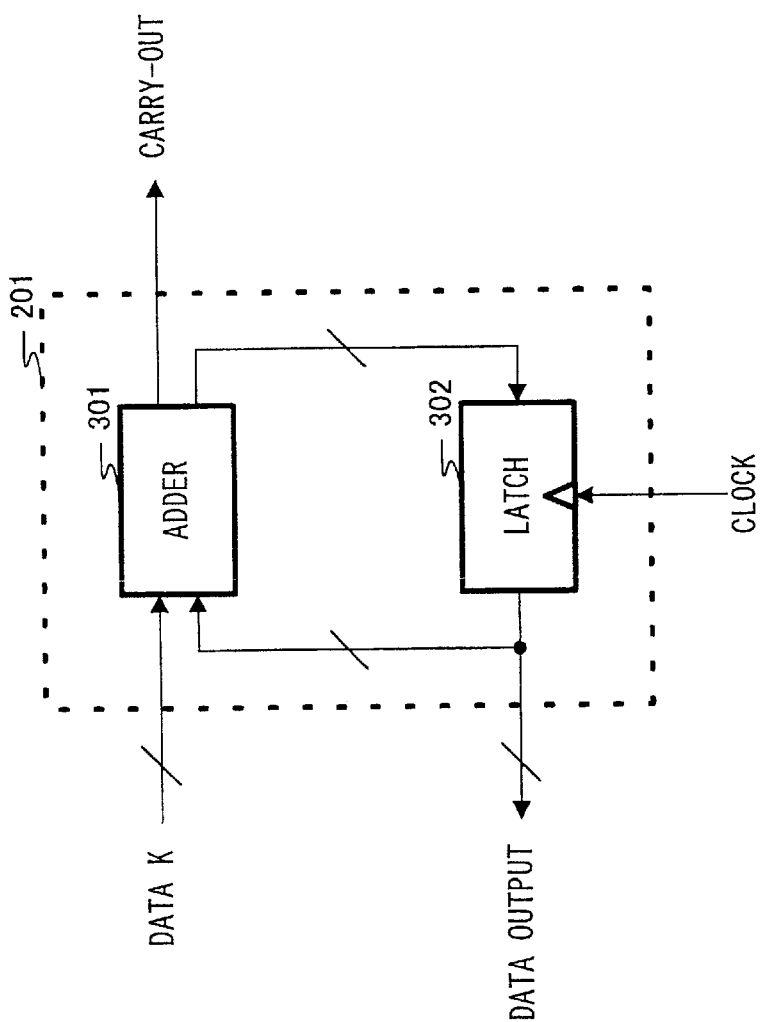
FIG. 5 is a block diagram showing an internal configuration of an accumulator of the frequency synthesizer according to the above embodiment.

FIG. 5 is a block diagram showing an internal configuration of accumulator 201 shown in FIG. 4.

As shown in FIG. 5, accumulator 201 is mainly configured by adder 301 and latch 302, and accumulates data K (K.: integer) input for every clock, outputs the accumulation result and outputs a carry-out signal to adder 203 when the accumulation result exceeds size L (L: integer) of the accumulator, that is, when adder 301 overflows in a cycle of L/(K×fref).

When adder 203 adds a random signal to the sum of the input data and carry-out signal, the frequency dividing ratio of first frequency divider 102, the addition result, changes randomly, and therefore spurious generated in the conventional synthesizer is converted to white noise.

Here, since the average value of the random signal is "0", even if the random signal is added to the carry-out signal, the frequency dividing ratio determined by the cycle of the carry-out signal is not affected. Furthermore, even if the average value of the random signal is not "0", correcting the value of K prevents the frequency of the output signal of VCO 101 from changing.

Thus, randomizing the periodicity of a carry-out signal by adding a random signal allows the spurious level to decrease, eliminating the need to increase a time constant of LPF 106 to suppress spurious, thus making it possible to shorten a lockup time.

Moreover, using a random signal generator can reduce the number of accumulators compared to the prior art and eliminate the need of delayers, making it possible to simplify the configuration of the frequency synthesizer and reduce power consumption.

Embodiment 2

Figure 6:
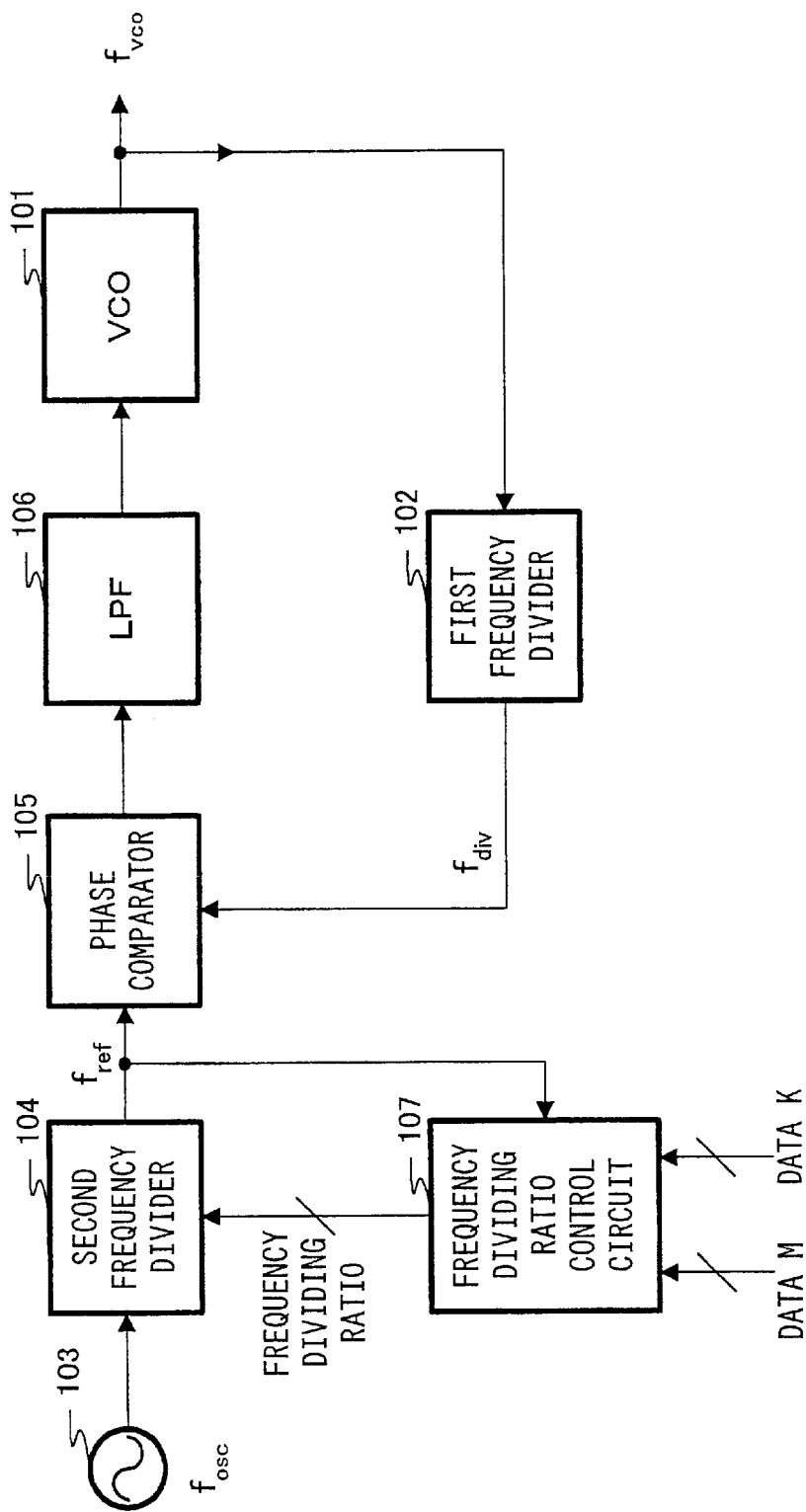
FIG. 6 is a block diagram showing a configuration of a frequency synthesizer according to Embodiment 2 of the present invention.

FIG. 6 is a block diagram showing a configuration of a frequency synthesizer according to Embodiment 2 of the present invention. The frequency synthesizer in FIG. 6 has the same components as those in FIG. 3 with a difference in a positional relationship between first frequency divider 102, second frequency divider 104 and frequency dividing ratio control circuit 107.

Frequency dividing ratio control circuit 107 calculates a frequency dividing ratio according to the same procedure as in Embodiment 1 using the output signal of second frequency divider 104 as a clock and outputs the calculated frequency dividing ratio to second frequency divider 104. The internal configuration of frequency dividing ratio control circuit 107 is the same as that shown in FIG. 4 in Embodiment 1.

Second frequency divider 104 divides frequency fosc of the reference signal with the frequency dividing ratio input from frequency dividing ratio control circuit 107 and outputs a signal of frequency fref. Here, suppose the frequency dividing ratio at first frequency divider 102 is N. Frequency fvco of the output signal of VCO 101 is obtained from expression (4) shown below:

$$fvco = N \times fosc \div (M+K/L) \qquad (4)$$

In above expression (4), it is possible to generate arbitrary frequency fvco by changing the values of M, K and L as required. Therefore, it is possible to set frequency dividing ratio N of first frequency divider 102 to a fixed value.

First frequency divider 102 divides frequency fvco of the output signal of VCO 101 based on a fixed frequency dividing ratio and outputs a signal of frequency fdiv.

Figure 7:
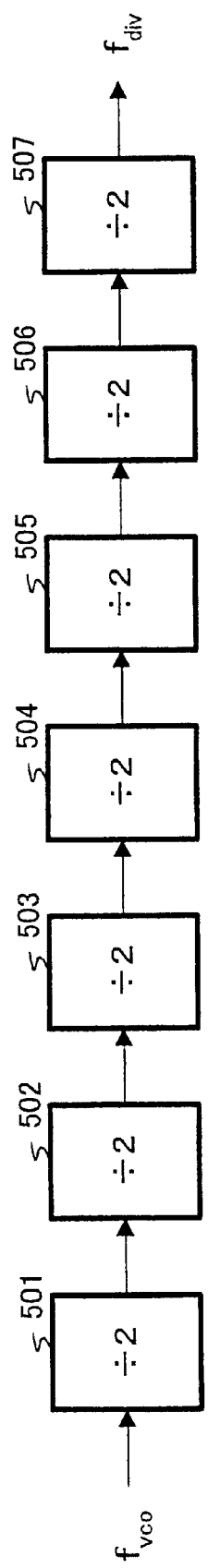
FIG. 7 is a block diagram showing an internal configuration of a first frequency divider of the frequency synthesizer according to the above embodiment.

FIG. 7 is a block diagram showing an internal configuration example of first frequency divider 102 of the frequency synthesizer according to this embodiment. FIG. 7 shows a configuration of first frequency divider 102 made up of cascaded divide-by-2 frequency dividers 501 to 507, creating frequency dividing ratio N=128. Therefore, in first frequency divider 102, posterior divide-by-2 frequency dividers have lower frequencies, hence less power consumption.

Moreover, setting high frequency fref can increase the loop gain of the PLL comprising the frequency synthesizer, thus making it possible to shorten the lockup time.

Figure 1:
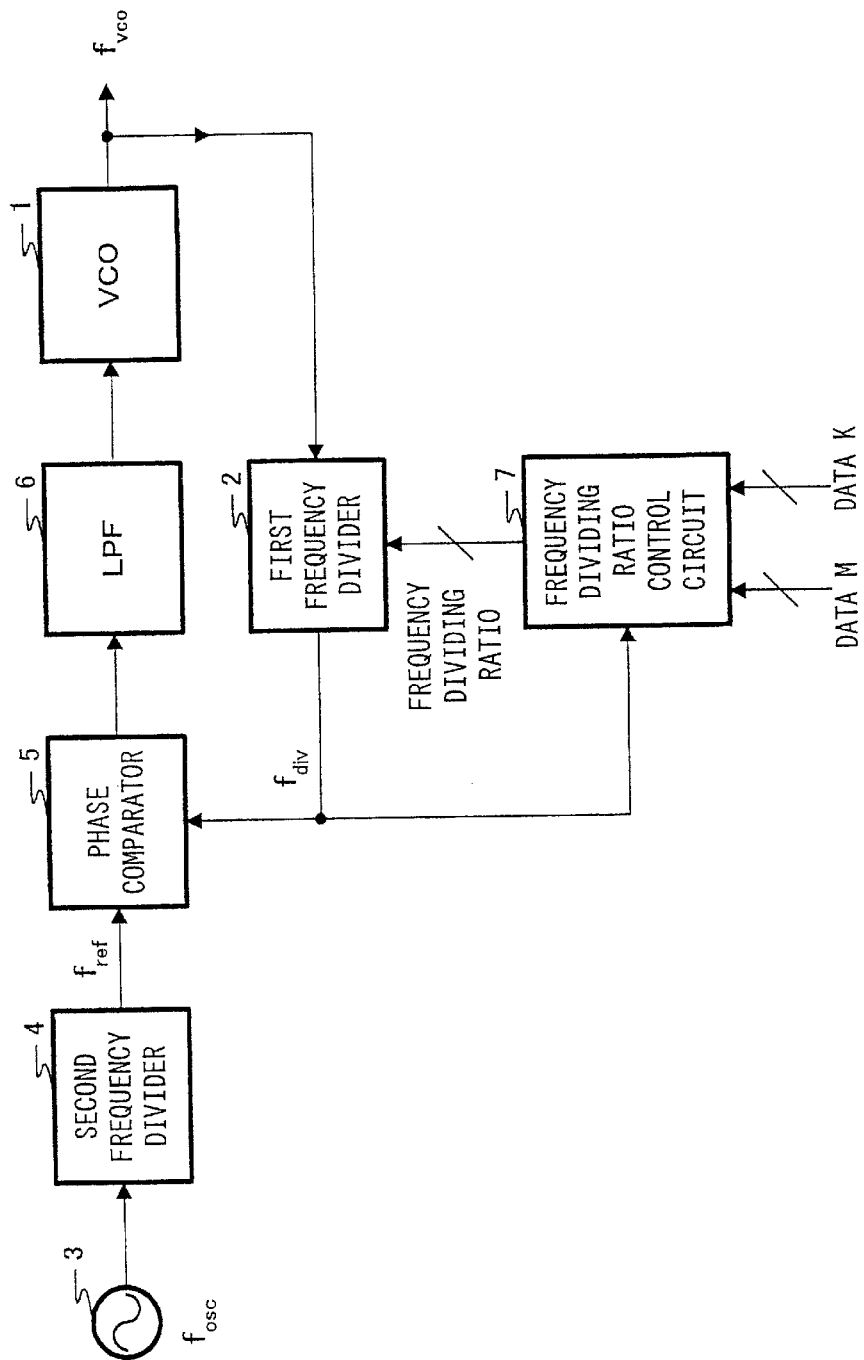
FIG. 1 is a block diagram showing a configuration of a conventional frequency synthesizer.
Figure 2:
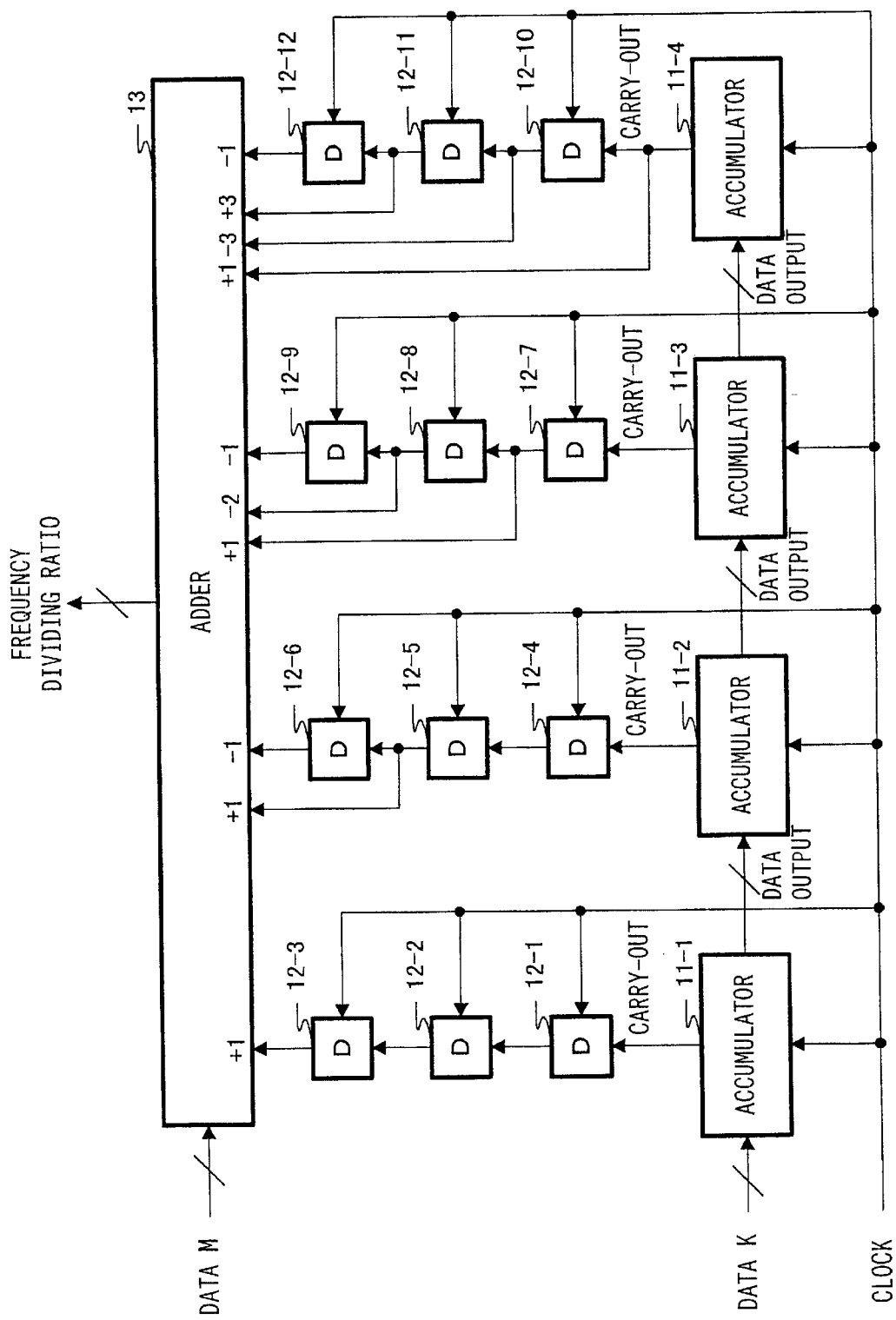
FIG. 2 is a block diagram showing an internal configuration of a frequency diving ratio control circuit in the conventional frequency synthesizer.

Here, suppose that frequency dividing ratio control circuit 107 is configured as shown in FIG. 2. The frequency dividing ratio changes from M+8 to M−7, M−7 must be >0, and therefore frequency dividing ratio M is at least 8.

Normally, TCXO is used for oscillator 103, which is a reference signal source and its frequency band is fixed at a 10 MHz band, and therefore if the frequency dividing ratio of second frequency divider 104 is large, it is not possible to set high frequency fref thus preventing the lockup time from being shortened.

On the other hand, suppose frequency dividing ratio control circuit 107 has the configuration shown in FIG. 4. Since the frequency dividing ratio changes from M+2 to M−1 and M−1>0, average frequency dividing ratio M is a minimum of 2.

That is, it is possible to reduce the frequency dividing ratio of second frequency divider 104 by configuring frequency dividing ratio control circuit 107 as shown in FIG. 4, thus making it possible to set high frequency fref and shorten the lockup time.

Embodiment 3

Figure 8:
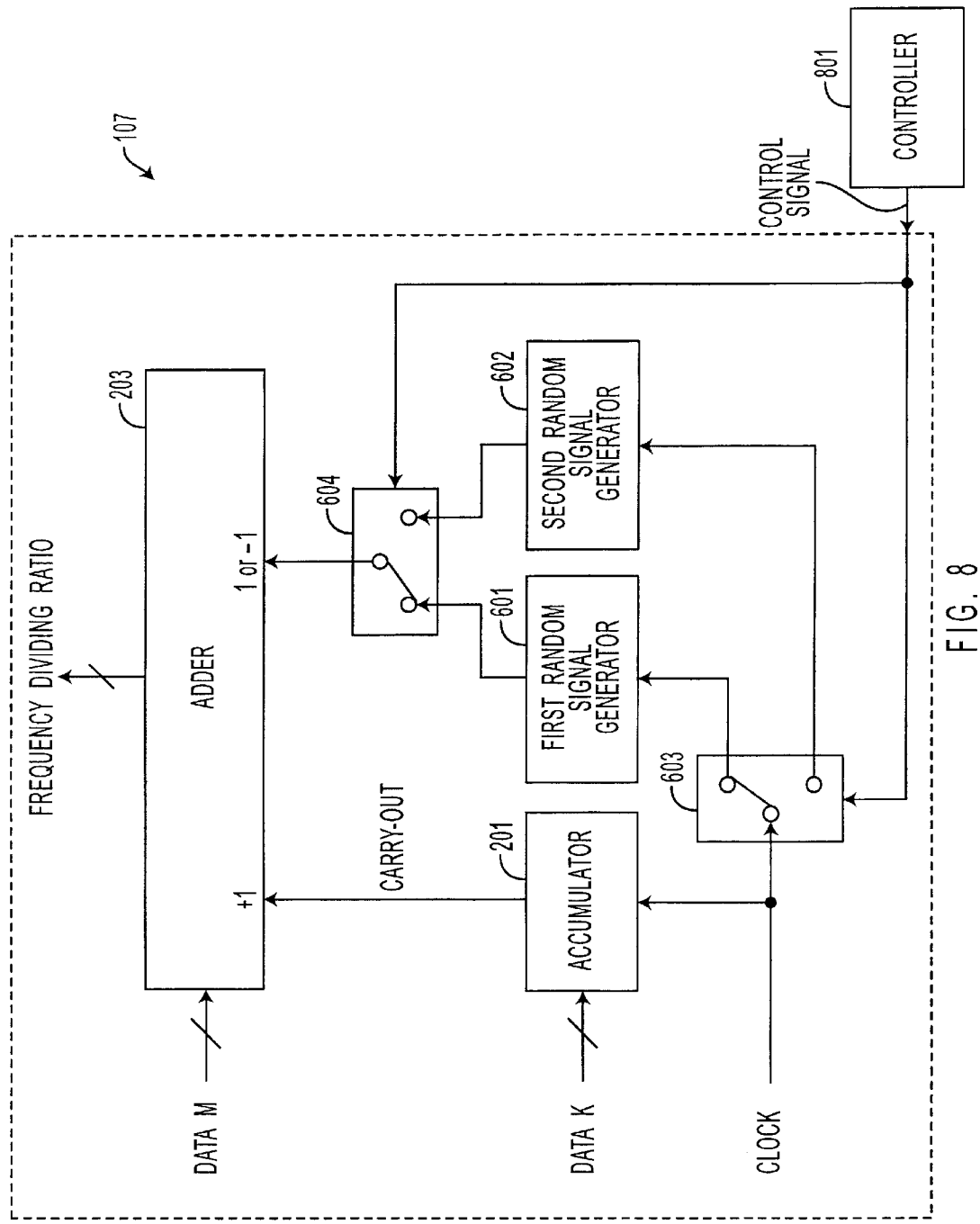
FIG. 8 is a block diagram showing an internal configuration of a frequency diving ratio control circuit of a frequency synthesizer according to Embodiment 3 of the present invention.

FIG. 8 is a block diagram showing an internal configuration of frequency dividing ratio control circuit 107 of a frequency synthesizer according to Embodiment 3 of the present invention. The overall configuration of the frequency synthesizer is the same as that in FIG. 3 in Embodiment 1. In frequency dividing ratio control circuit 107 in FIG. 8, the same components as those in FIG. 4 are assigned the same reference numerals and their explanations will be omitted.

In comparison with FIG. 4, frequency dividing ratio control circuit 107 in FIG. 8 adopts a configuration with first random signal generator 601 and second random signal generator 602 instead of random signal generator 202, with distributor 603 and selector 604 added.

First random signal generator 601 and second random signal generator 602 generate random signals with mutually different bit lengths.

Distributor 603 outputs a clock signal to either first random signal generator 601 or second random signal generator 602 based on a control signal from the outside.

Selector 604 outputs a random signal input from first random signal generator 601 or second random signal generator 602 to adder 203 based on a control signal from the outside.

The longer the bit length of a random signal, the wider band white noise spreads over, which reduces the spurious level. On the other hand, however, increasing the bit length of the random signal requires the scale of the circuit of the random signal generator to be increased, resulting in increased power consumption.

The amount of suppression of spurious and noise characteristic required vary depending on the system using the frequency synthesizer and an optimal bit length of a random signal depends on the tradeoff of the relevant system.

The frequency synthesizer according to this embodiment shown in FIG. 8 allows a control signal from the outside, for example, from controller 801, to change the bit length of a random signal, providing a higher level of general-purposedness than Embodiment 1.

For brevity of explanation, this embodiment adopts a configuration selecting two kinds of random signal, but the present invention is not limited to this and any configuration is acceptable if it allows a control signal to change the bit length.

On the other hand, a spurious frequency can vary depending on the value of data K because the spurious frequency is determined by the periodicity of a carry-out signal output from accumulator 201. That is, there is an optimal bit length determined by tradeoff for every frequency of the output signal of VCO 101. Changing the bit length of a random signal according to the frequency of the output signal of VCO 101 makes it possible to reduce power consumption to a necessary minimum for every frequency.

The frequency synthesizers of the above embodiments can be mounted on a base station apparatus or communication terminal apparatus in a radio communication system. At this time, the frequency synthesizer is especially required to secure the spurious characteristic during transmission and reduce power consumption during reception. That is, performance required is different for transmission and for reception, and therefore changing the bit length of a random signal for transmission time slots and for reception time slots in a time-division multiplexing communication makes it possible to reduce power consumption to a necessary minimum for the base station apparatus or communication terminal apparatus in the radio communication system as a whole.

Furthermore, the frequency synthesizers of the embodiments above can be mounted in a base station apparatus or a communication terminal apparatus in a radio communication system. Mounting the frequency synthesizer of the present invention in a mobile radio set such as a cellular phone particularly eliminates the need to secure a long lockup time, making it possible to reduce the operation time ratio during intermittent reception and extend a standby time. The present invention can also reduce power consumption and thereby increase hours of conversation.

As described above, the frequency synthesizer and oscillation frequency control method of the present invention changes the frequency dividing ratio randomly by adding a random signal to a carry-out signal, converts spurious to white noise and can thereby optimally maintain the spurious characteristic, shorten the lockup time and reduce power consumption.

The present invention is not limited to the above described embodiments, and various variations and modifications may be possible without departing from the scope of the present invention.

This application is based on the Japanese Patent Application No.HEI 11-308132 filed on Oct. 29, 1999, entire content of which is expressly incorporated by reference herein.

What is claimed is:

1. A frequency synthesizer, comprising:
    a voltage control oscillator that provides a second signal of a frequency corresponding to a voltage of a previously generated first signal;
    a first frequency divider that divides the frequency of said second signal and outputs a third signal;
    a second frequency divider that divides the frequency of a reference signal and outputs a fourth signal;
    a phase comparator that generates the first signal from the phase difference between said third signal and said fourth signal and outputs the first signal to said voltage control oscillator; and
    a frequency dividing ratio controller that controls a frequency dividing ratio so that the frequency dividing ratio changes substantially randomly with time and an average value of the frequency dividing ratio includes decimals, wherein the frequency dividing ratio controller comprises:
        an accumulator that generates a carry-out signal when an accumulated value of first input data exceeds a predetermined value;
        a random signal generator that generates a random signal whose value changes substantially randomly;
        a bit length controller that variably controls the bit length of the random signal; and
        an adder that adds said carry-out signal and said random signal to second input data and outputs the addition result of said adder as the frequency dividing ratio.

2. The frequency synthesizer according to claim 1, wherein the frequency dividing ratio controller comprises a plurality of random signal generators, which each have different bit lengths, and the bit length controller selects one of said plurality of random signal generators and distributes a clock signal to the selected random signal generator.

3. The frequency synthesizer according to claim 1, wherein the bit length controller variably controls the bit length of the random signal based on the frequency of the second signal of the voltage control oscillator.

4. The frequency synthesizer according to claim 1, wherein the bit length controller variably controls the bit length of the random signal using transmission time slots and reception time slots.

5. A frequency synthesizer, comprising:
a voltage control oscillator that provides a second signal of a frequency corresponding to a voltage of a previously generated first signal;
a first frequency divider that divides the frequency of said second signal and outputs a third signal;
a second frequency divider that divides the frequency of a reference signal and outputs a fourth signal;
a phase comparator that generates the first signal from the phase difference between said third signal and said fourth signal and outputs the first signal to said voltage control oscillator; and
a frequency dividing ratio controller that controls a frequency dividing ratio so that the frequency dividing ratio changes substantially randomly with time and an average value of the frequency dividing ratio includes decimals, wherein the frequency dividing ratio controller comprises:
an accumulator that generates a carry-out signal when an accumulated value of first input data exceeds a predetermined value;
a random signal generator that generates a random signal whose value changes substantially randomly; and
an adder that adds said carry-out signal and said random signal to second input data and outputs the addition result of said adder as the frequency dividing ratio,
wherein the frequency dividing ratio controller outputs the frequency dividing ratio to the first frequency divider and said first frequency divider divides the frequency of the second signal with the frequency dividing ratio output from said frequency dividing ratio controller.

6. A frequency synthesizer, comprising:
a voltage control oscillator that provides a second signal of a frequency corresponding to a voltage of a previously generated first signal;
a first frequency divider that divides the frequency of said second signal and outputs a third signal;
a second frequency divider that divides the frequency of a reference signal and outputs a fourth signal;
a phase comparator that generates the first signal from the phase difference between said third signal and said fourth signal and outputs the first signal to said voltage control oscillator; and
a frequency dividing ratio controller that controls a frequency dividing ratio so that the frequency dividing ratio changes substantially randomly with time and an average value of the frequency dividing ratio includes decimals, wherein the frequency dividing ratio controller comprises:
an accumulator that generates a carry-out signal when an accumulated value of first input data exceeds a predetermined value;
a random signal generator that generates a random signal whose value changes substantially randomly; and
an adder that adds said carry-out signal and said random signal to second input data and outputs the addition result of said adder as the frequency dividing ratio,
wherein the frequency dividing ratio controller outputs the frequency dividing ratio to the second frequency divider and said second frequency divider divides the frequency of the reference signal with the frequency dividing ratio output from said frequency dividing ratio controller.

7. The frequency synthesizer according to claim 6, wherein the first frequency divider comprises a plurality of cascaded frequency dividers.

8. A base station apparatus equipped with a frequency synthesizer, said frequency synthesizer comprising:
a voltage control oscillator that provides a second signal of a frequency corresponding to a voltage of a previously generated first signal;
a first frequency divider that divides the frequency of said second signal and outputs a third signal;
a second frequency divider that divides the frequency of a reference signal and outputs a fourth signal;
a phase comparator that generates the first signal from the phase difference between said third signal and said fourth signal and outputs the first signal to said voltage control oscillator;
an accumulator that generates a carry-out signal when an accumulated value of first input data exceeds a predetermined value;
a random signal generator that generates a random signal whose value changes substantially randomly;
a bit length controller that variably controls the bit length of the random signal; and
an adder that adds said carry-out signal and said random signal to second input data and outputs the addition result of said adder as a frequency dividing ratio.

9. A communication terminal apparatus equipped with a frequency synthesizer, said frequency synthesizer comprising:
a voltage control oscillator that provides a second signal of a frequency corresponding to a voltage of a previously generated first signal;
a first frequency divider that divides the frequency of said second signal and outputs a third signal;
a second frequency divider that divides the frequency of a reference signal and outputs a fourth signal;
a phase comparator that generates the first signal from the phase difference between said third signal and said fourth signal and outputs the first signal to said voltage control oscillator;
an accumulator that generates a carry-out signal when an accumulated value of first input data exceeds a predetermined value;
a random signal generator that generates a random signal whose value changes substantially randomly;
a bit length controller that variably controls the bit length of the random signal; and
an adder that adds said carry-out signal and said random signal to second input data and outputs the addition result of said adder as a frequency dividing ratio.

10. A frequency dividing ratio control method, comprising:
generating a carry-out signal when an accumulated value of first input data exceeds a predetermined value;
generating a random signal whose value changes substantially randomly;
variably controlling the bit length of the random signal; and
generating a frequency dividing ratio by adding said carry-out signal and said random signal to second input data.

11. An oscillation frequency control method comprising the steps of:
oscillating a second signal of a frequency corresponding to a voltage of a first signal;
outputting a third signal by dividing the frequency of said second signal based on the frequency dividing ratio generated using the frequency dividing ratio control method according to claim 10,
outputting a fourth signal by dividing the frequency of a reference signal based on a fixed frequency dividing ratio; and
generating said first signal from the phase difference between said third signal and said fourth signal.

12. An oscillation frequency control method comprising:
oscillating a second signal of a frequency corresponding to a voltage of a first signal;
outputting a third signal by dividing the frequency of said second signal based on a fixed frequency dividing ratio;
outputting a fourth signal by dividing the frequency of a reference signal based on the frequency dividing ratio generated using the frequency dividing ratio control method according to claim 10; and
generating a next first signal from the phase difference between said third signal and said fourth signal.

13. A frequency synthesizer, comprising:
a voltage control oscillator that provides a second signal of a frequency corresponding to a voltage of a previously generated first signal;
a first frequency divider that divides the frequency of said second signal and outputs a third signal;
a second frequency divider that divides the frequency of a reference signal and outputs a fourth signal;
a phase comparator that generates the first signal from the phase difference between said third signal and said fourth signal and outputs the first signal to said voltage control oscillator; and
a frequency dividing ratio controller that controls a frequency dividing ratio so that the frequency dividing ratio changes substantially randomly with time and an average value of the frequency dividing ratio includes decimals, wherein the frequency dividing ratio controller comprises:
an accumulator that generates a carry-out signal when an accumulated value of first input data exceeds a predetermined value;
a random signal generator that generates a random signal whose value changes substantially randomly; and
an adder that adds said carry-out signal and said random signal to second input data and outputs the addition result of said adder as the frequency dividing ratio,
wherein said adder does not add a contribution from said first input data to the frequency dividing ratio, except as said first input data is accumulated into said carry-out data by said accumulator.

14. A base station apparatus equipped with a frequency synthesizer, said frequency synthesizer comprising:
a voltage control oscillator that provides a second signal of a frequency corresponding to a voltage of a previously generated first signal;
a first frequency divider that divides the frequency of said second signal and outputs a third signal;
a second frequency divider that divides the frequency of a reference signal and outputs a fourth signal;
a phase comparator that generates the first signal from the phase difference between said third signal and said fourth signal and outputs the first signal to said voltage control oscillator;
an accumulator that generates a carry-out signal when an accumulated value of first input data exceeds a predetermined value;
a random signal generator that generates a random signal whose value changes substantially randomly; and
an adder that adds said carry-out signal and said random signal to second input data and outputs the addition result of said adder as a frequency dividing ratio,
wherein said adder does not add a contribution from said first input data to the frequency dividing ratio, except as said first input data is accumulated into said carry-out data by said accumulator.

15. A communication terminal equipped with a frequency synthesizer, said frequency synthesizer comprising:
a voltage control oscillator that provides a second signal of a frequency corresponding to a voltage of a previously generated first signal;
a first frequency divider that divides the frequency of said second signal and outputs a third signal;
a second frequency divider that divides the frequency of a reference signal and outputs a fourth signal;
a phase comparator that generates the first signal from the phase difference between said third signal and said fourth signal and outputs the first signal to said voltage control oscillator;
an accumulator that generates a carry-out signal when an accumulated value of first input data exceeds a predetermined value;
a random signal generator that generates a random signal whose value changes substantially randomly; and
an adder that adds said carry-out signal and said random signal to second input data and outputs the addition result of said adder as a frequency dividing ratio,
wherein said adder does not add a contribution from said first input data to the frequency dividing ratio, except as said first input data is accumulated into said carry-out data by said accumulator.

16. A frequency dividing ratio control method comprising generating a carry-out signal when an accumulated value of first input data exceeds a predetermined value, generating a random signal whose value changes substantially randomly, and generating a frequency dividing ratio by adding said carry-out signal and said random signal to second input data, wherein said frequency dividing ratio does not include a contribution from said first input data, except as said first input data is accumulated into said carry-out data.

17. The frequency synthesizer according to claim 1, wherein said frequency dividing ratio controller includes said bit length controller.

* * * * *